US008184741B2

(12) United States Patent
He et al.

(10) Patent No.: US 8,184,741 B2
(45) Date of Patent: May 22, 2012

(54) MULTI-SYSTEM SIGNAL RECEIVING DEVICE AND METHOD THEREOF

(75) Inventors: Wei-Hung He, Taipei Hsien (TW); Chin-Tai Chen, Taoyuan County (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 718 days.

(21) Appl. No.: 12/099,783

(22) Filed: Apr. 9, 2008

(65) Prior Publication Data

US 2008/0247495 A1 Oct. 9, 2008

(30) Foreign Application Priority Data

Apr. 9, 2007 (TW) ................................ 96112296 A

(51) Int. Cl.
*H03K 9/00* (2006.01)

(52) U.S. Cl. ...... 375/316; 340/3.2; 340/681; 348/425.4; 348/500; 370/241; 370/324; 370/520; 375/145; 375/149; 375/240.28

(58) Field of Classification Search ........................ None
See application file for complete search history.

(56) References Cited

U.S. PATENT DOCUMENTS

| | | | | |
|---|---|---|---|---|
| 5,373,255 | A * | 12/1994 | Bray et al. | 331/1 A |
| 5,416,767 | A | 5/1995 | Koppelaar | |
| 6,038,275 | A * | 3/2000 | Taura et al. | 375/371 |
| 7,187,913 | B1 * | 3/2007 | Rahn et al. | 455/188.1 |
| 2004/0264560 | A1 | 12/2004 | Demir | |
| 2005/0070228 | A1 | 3/2005 | Hara | |
| 2005/0147186 | A1 * | 7/2005 | Funamoto et al. | 375/324 |
| 2006/0285616 | A1 | 12/2006 | Yen | |

* cited by examiner

*Primary Examiner* — David C. Payne
*Assistant Examiner* — Adolf Dsouza
(74) *Attorney, Agent, or Firm* — Winston Hsu; Scott Margo

(57) ABSTRACT

A receiving device includes: a first signal processor, for receiving a radio frequency signal, and converting the radio frequency signal to generate a first signal, where the radio frequency signal includes a plurality of frames; a second signal processor, coupled to the first signal processor, for performing a Fourier transform operation on the first signal according to a synchronization signal to generate an output signal; a first filter, coupled to the first signal processor, for filtering the first signal to generate a second signal; and a synchronization detection circuit, coupled to the first filter, for detecting the second signal to generate the synchronization signal. The first signal includes a channel signal and at least a portion of neighboring channel signals from neighboring channels, and the output signal corresponds to the channel signal.

20 Claims, 8 Drawing Sheets

MULTI-SYSTEM SIGNAL RECEIVING DEVICE AND METHOD THEREOF

BACKGROUND OF THE INVENTION

1. Field of the Invention

The claimed invention relates to digital broadcast devices, and more particularly, to multi-system digital broadcast signal receiving devices.

2. Description of the Prior Art

Digital broadcast signals can be categorized into digital audio broadcasting (DAB) signals and digital video broadcasting (DVB) signals, where the DAB signals correspond to various standards such as Eureka-147 in Europe (also adopted by Taiwan), IBOC in the USA and DRM in France, and the DVB signals correspond to various standards such as DVB-T and DVB-H, whose signals have different bandwidths, for example, the bandwidth of DVB is 6, 7, or 8 MHz, and the bandwidth of DAB is 1.536 MHz. In addition, some countries also develop other standards such as T-DMB (e.g. a Korean mobile TV standard). Therefore, to receive these multi-system signals, the receiving systems have to be provided with special design.

In order to integrate multi-system signal receiving system into a single receiver, sharing a common tuner seems to be a feasible way that may accomplish the purpose. Since surface acoustic wave (SAW) filters are used as channel selection filters within tuners, digital filters can be utilized for selecting channels regarding standard(s) with a narrower signal bandwidth (such as DAB) in order to prevent from using SAW filters of various bandwidths and hence to prevent from raising the corresponding cost. FIG. 1 illustrates a conventional receiving system for the DVB-T and DAB standards. Please refer to FIG. 1. The receiving system 100 comprises a tuner 101, an analog-to-digital converter (ADC) 103, a down converter 105, a digital low pass filter 107, a fast Fourier transform (FFT) circuit 109, a back-end processing circuit 111 and a synchronization circuit 113, where the synchronization circuit 113 is utilized for providing the FFT circuit 109 with synchronization information. Detailed structure and operations of the receiving system 100 according to the prior art are well known by those skilled in the art, and therefore, are omitted here for brevity.

Please note that the conventional receiving system 100 adopts a high order digital low pass filter 107 to correctly receive signals. Since the digital low pass filter 107 has to filter DAB signals out and the bandwidth of the guard band between DAB channels is about only 176 KHz, a high order digital low pass filter is required. FIG. 2 illustrates the frequency response of the digital low pass filter shown in FIG. 1, where the bold line portion represents the frequency response of the digital low pass filter 107 having its pass-band frequency and stop-band frequency being 768 KHz and 944 KHz, respectively. If the conventional receiving system 100 uses the lower order digital low pass filter 107, the synchronization circuit 113 may be unable to precisely detect DAB frames due to adjacent channel signal (ACS) interference, and therefore, be unable to output correct synchronization signals. As a result, the FFT circuit is incapable of correctly performing FFT operations.

As the conventional architecture is hard to prevent from utilizing a circuit having higher cost, such as the high order digital low pass filter, a novel invention is required for solving the problems mentioned above.

SUMMARY OF THE INVENTION

It is an object of the claimed invention to provide receiving devices for receiving multi-system signals.

It is an object of the claimed invention to provide receiving devices and methods for utilizing the same SAW filter to process multi-system signals.

It is an object of the claimed invention to provide at least two filters with different bandwidths for receiving multi-system signals.

It is an object of the claimed invention to provide signal processing devices and methods for attaining the additional benefit of power saving without losing the above-mentioned functionality.

These and other objectives of the present invention will no doubt become obvious to those of ordinary skill in the art after reading the following detailed description of the preferred embodiment that is illustrated in the various figures and drawings.

DETAILED DESCRIPTION

For the convenience of describing the present invention, a digital broadcasting receiving device where a DVB-T standard (which has 6 MHz bandwidth) and a DAB standard (which has 1.536 MHz) are integrated for implementation is taken for instance. However, this should not be a limitation of the present invention. Of course, other audio broadcasting signal standards, such as DVB-H, IBOC in the USA, and DRM in France, can be integrated for implementation according to different embodiments of the present invention.

Figure 1:
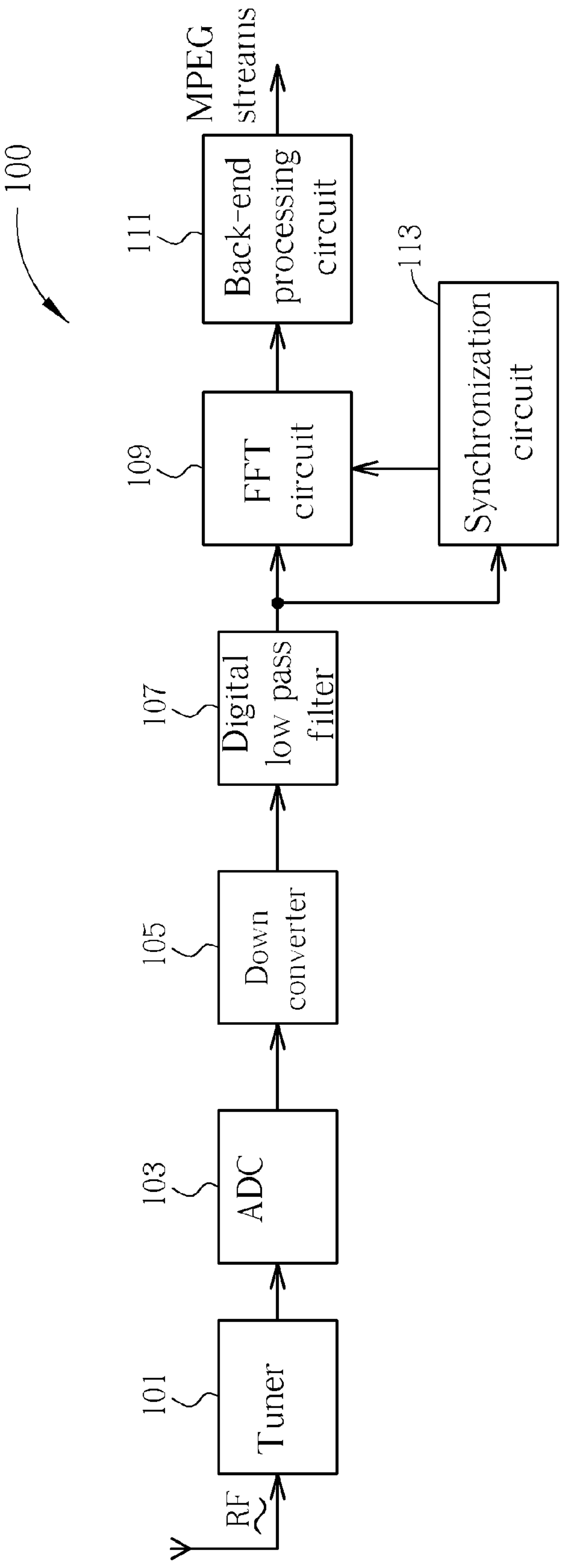
FIG. 1 PRIOR ART
FIG. 1 illustrates a receiving system of the DVB-T standard of the prior art.
Figure 2:
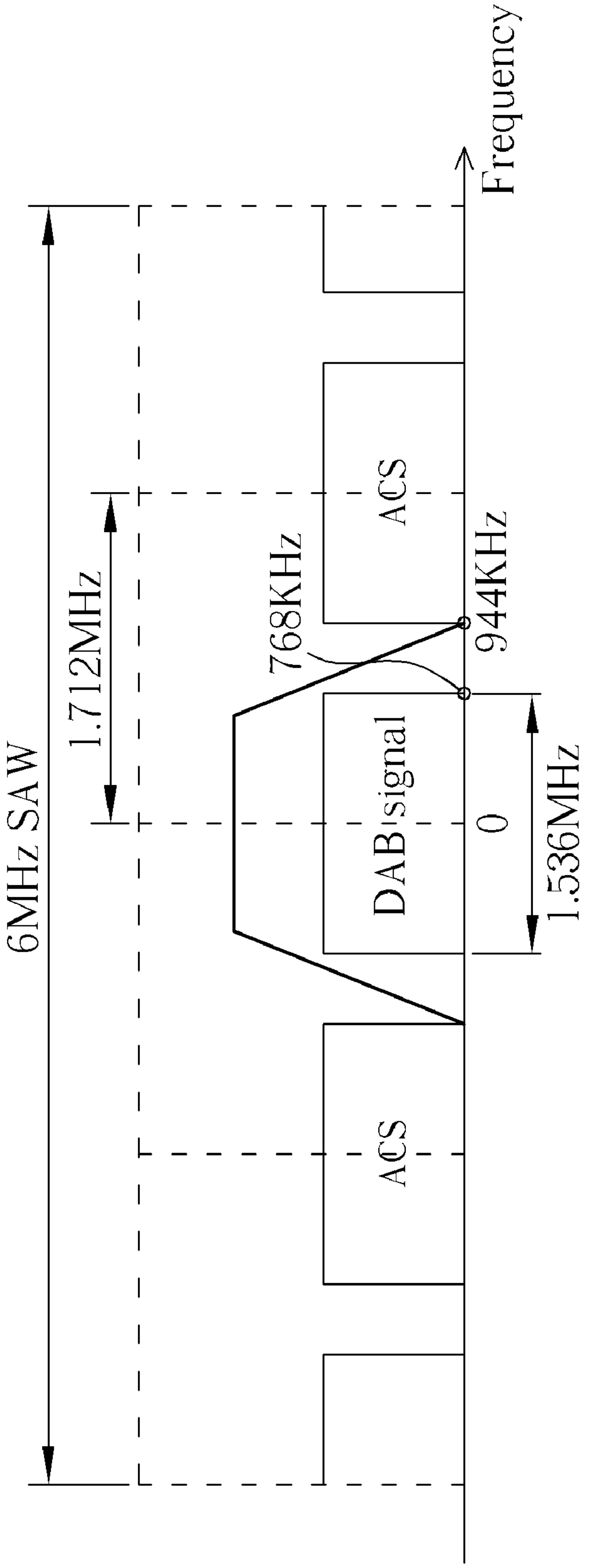
FIG. 2 PRIOR ART
FIG. 2 illustrates the frequency response of the higher order filter of FIG. 1.
Figure 3:
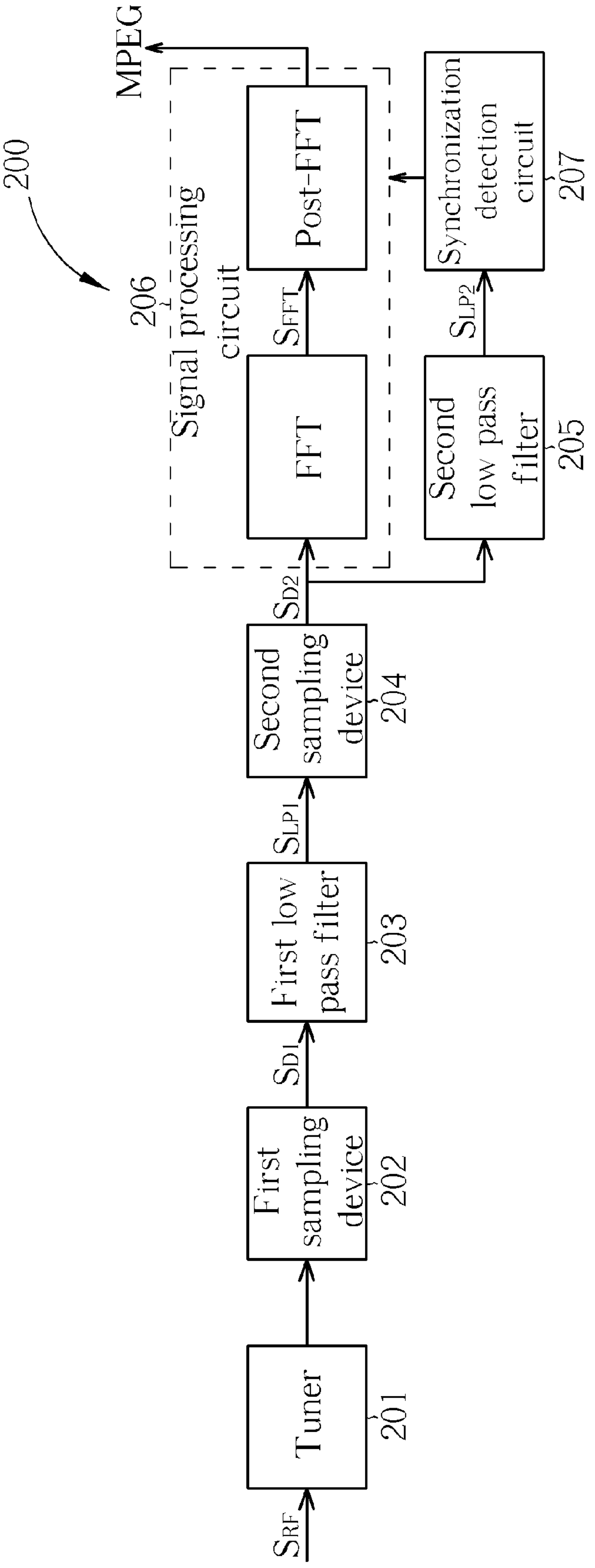
FIG. 3 illustrates a receiving device according to a first embodiment of the present invention.

FIG. 3 is a diagram of the receiving device 200 according to a first embodiment of the present invention. The receiving device 200 comprises a tuner 201, a first sampling device 202, a first low pass filter 203, a second sampling device 204, a second low pass filter 205, a signal processing circuit 206, and a synchronization detection circuit 207. In an embodiment, the first sampling device 202 can be implemented by an ADC. In another embodiment, the second sampling device 204 can be implemented by a down converter. Operations and principles of the signal processing circuit 206 (which comprises, for example, an FFT circuit and a post-FFT processing circuit) and the synchronization detection circuit 207 are well known to those skilled in the art, and therefore, are not described in detail.

According to the first embodiment, the first sampling device 202 is an ADC whose sampling frequency is 8.192 MHz.

Figure 4:
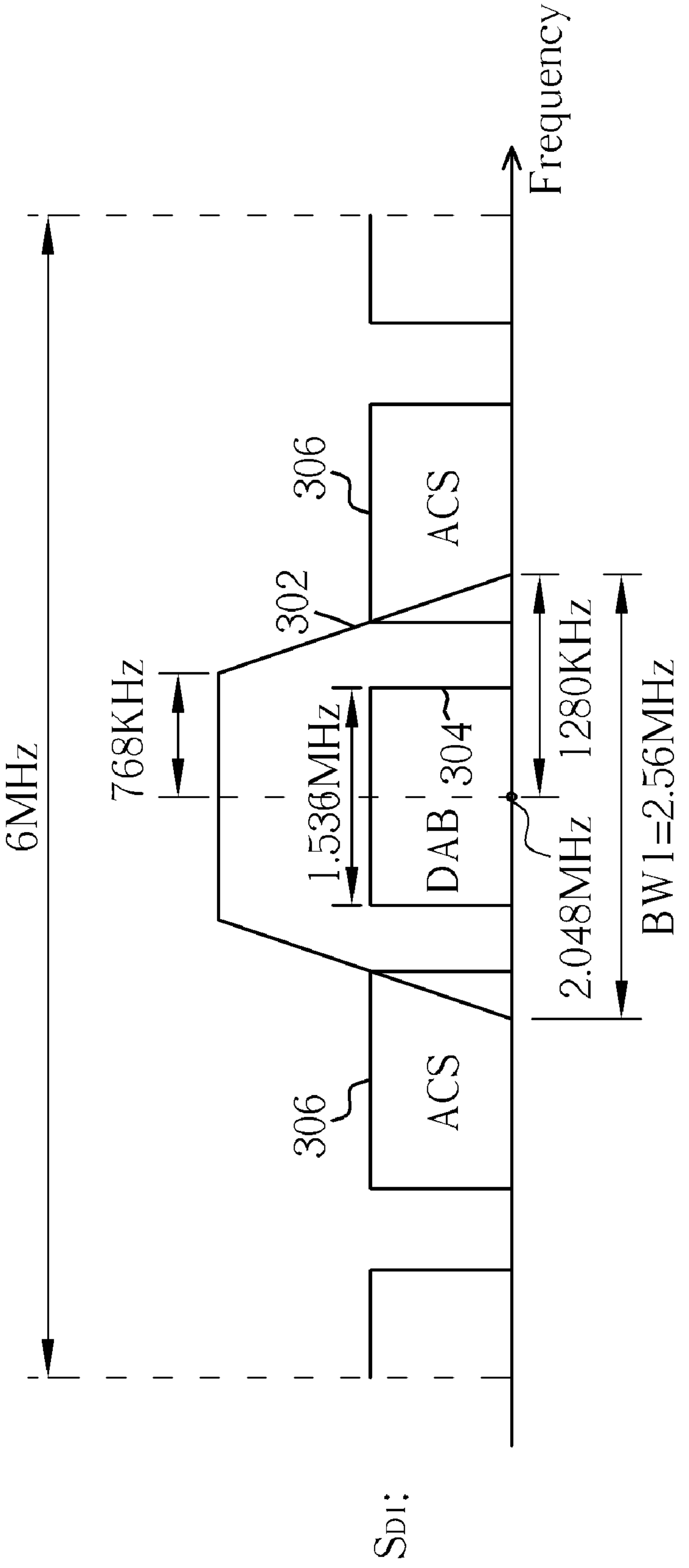
FIG. 4 illustrates the frequency response of the first low pass filter shown in FIG. 3.
Figure 5:
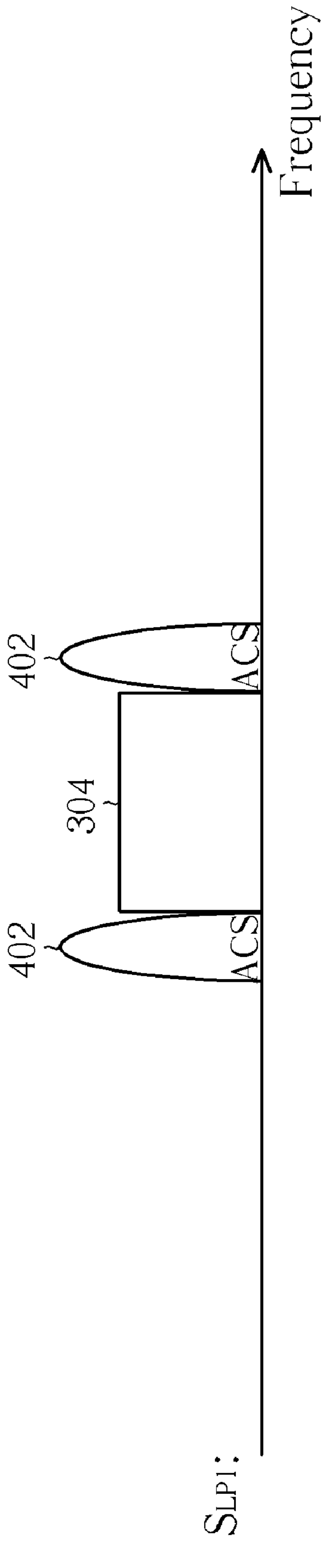
FIG. 5 illustrates a first low pass output signal of the first low pass filter.

In addition, in this embodiment, the first low pass filter 203 is a lower order digital filter. FIG. 4 illustrates the frequency response of the first low pass filter 203 of this embodiment, where the curve 302 represents the frequency response of the low pass filter 203 whose pass band and stop band are 768 KHz and 1280 KHz, respectively. The curve 304 represents the DAB signal processed by a signal processing device such as the receiving device 200, where the bandwidth of the DAB signal is 1.536 MHz. The curves 306 represent adjacent channel signals (ACS) of the first signal $S_{D1}$. As shown in FIG. 4, the first filter bandwidth BW1 of the first low pass filter 203 includes not only the required DAB signal but also a portion of the ACS. FIG. 5 illustrates the first low pass output signal $S_{LP1}$ outputted by the first low pass filter 203, where the first low pass output signal $S_{LP1}$ comprises the required DAB signal (represented by the curve 304 in FIG. 5) and a portion of the ACS (represented by the curves 402 in FIG. 5).

The second sampling device 204 further samples the first low pass output signal $S_{LP1}$ with the sampling frequency of 2.048 MHz to output the second digital signal $S_{D2}$. Then the second digital signal $S_{D2}$ may be inputted into the signal processing circuit 206 for further processing. It can be appreciated that the second sampling device 204 can be omitted or be integrated into one of the other circuits within the receiving device 200 according to different variations of this embodiment.

Those who are familiar with orthogonal frequency division multiplexing (OFDM) would appreciate that even though the first low pass output signal $S_{LP1}$ (or the second digital signal $S_{D2}$) comprises unnecessary signals (e.g. a portion of the ACS), the FFT circuit of the signal processing circuit 206 may still correctly demodulate the first low pass output signal $S_{LP1}$ (or the second digital signal $S_{D2}$) according to a synchronization signal and OFDM signal characteristics to derive the required data since the DAB signal to be processed complies with OFDM signal requirements. Please refer to FIG. 4. The DAB signal has a guard band of 176 KHz. In the situation where the signal processing circuit 206 may correctly demodulate the required data, the first low pass filter 203 can be implemented with a lower order low pass filter (whose pass band and stop band are respectively 768 KHz and 1280 KHz in this embodiment) and therefore the overall cost of the receiving device 200 can be reduced. In one embodiment, the output signal of the signal processing circuit 206 comprises data complying with a motion picture expert group (MPEG) format.

Figure 6:
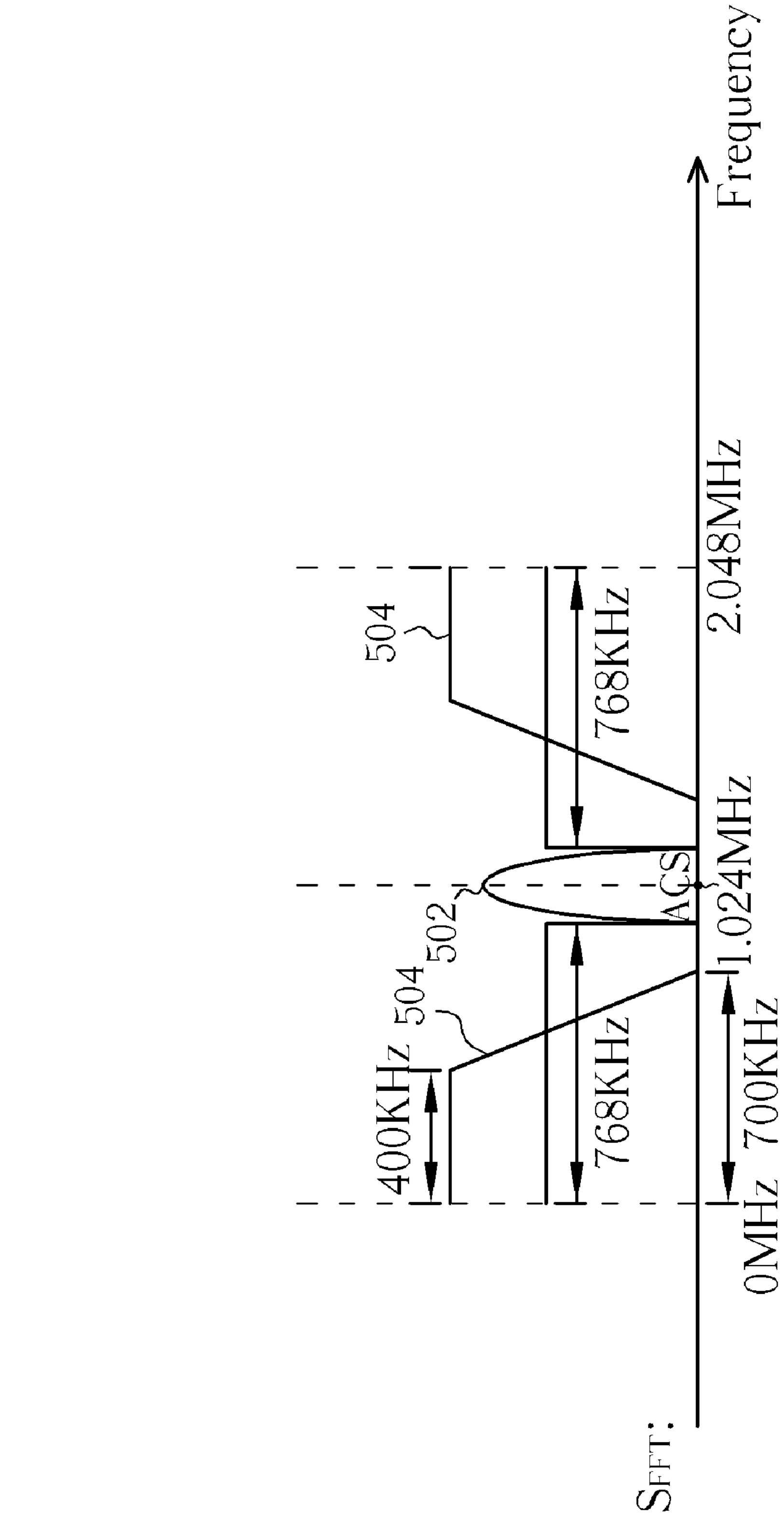
FIG. 6 illustrates the relationship between the spectrum of the demodulated signal of the signal processing circuit shown in FIG. 3 and the frequency response of the second low pass filter shown in FIG. 3.
Figure 7:
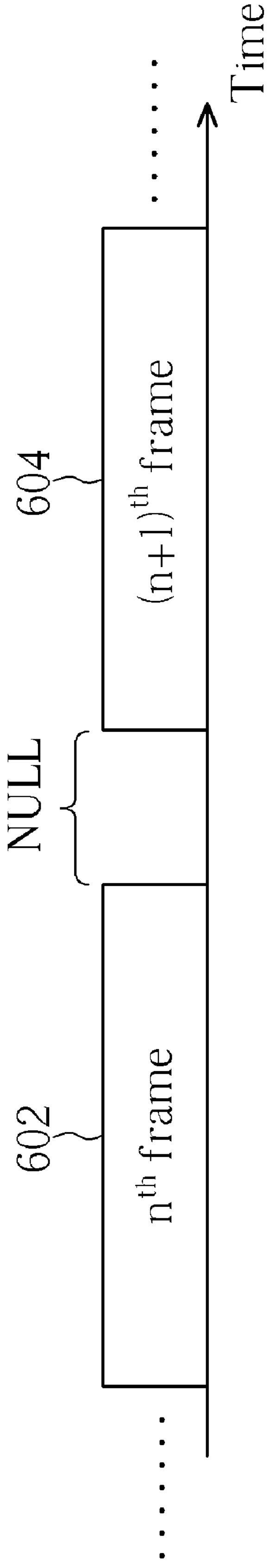
FIG. 7 illustrates frames of a DAB signal.

FIG. 6 illustrates the relationship between the spectrum of the demodulated signal $S_{FFT}$ outputted by the FFT circuit of the signal processing circuit 206 and the frequency response of the second low pass filter 205. As shown in FIG. 6, the ACS that is not filtered out by the first low pass filter 203 (e.g. the ACS represented by the curve 502) will appear in a higher frequency region, which is around the frequency of 1.024 MHz in this embodiment. And the curve 504 represents the frequency response of the second low pass filter 205, whose pass band and stop band are respectively 400 KHz and 700 KHz in this embodiment. FIG. 7 is the timing chart of frames of the DAB signal. As shown in FIG. 7, between frames of the DAB signal, such as the $n^{th}$ frame 602 and the $(n+1)^{th}$ frame 604 of the DAB signal, there is a NULL period, which means no signal is transmitted in this period.

Figure 8:
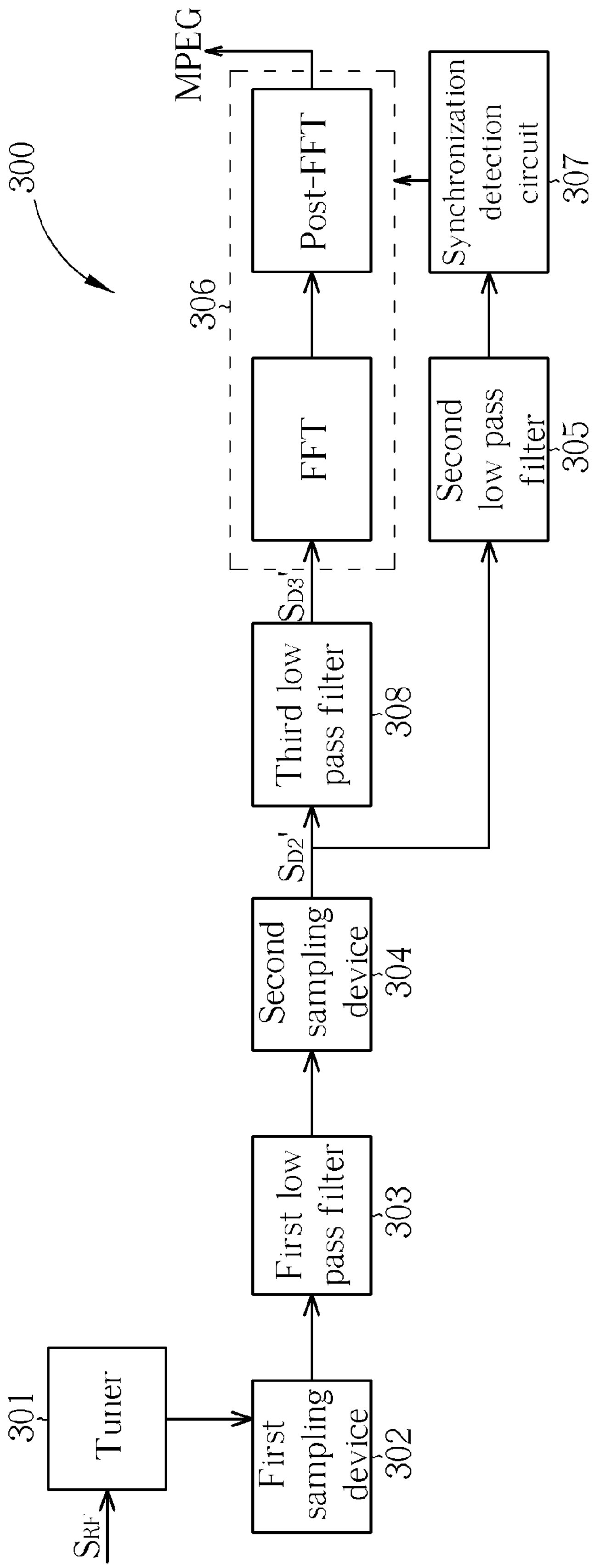
FIG. 8 illustrates a receiving device according to a second embodiment of the present invention.

For preventing the ACS from interfering the detection of the NULL period, the second low pass filter 205 is utilized for filtering out the ACS. In a preferred embodiment, in order to reduce the filter order of the second low pass filter 205 (in a situation where the second filtering bandwidth BW2 is increased as well), a portion of the frequency band of the DAB signal will be filtered out by the second low pass filter 205, without hindering the functionality of the NULL period detection performed by the synchronization detection circuit 207. When the synchronization detection circuit 207 detects the location of the NULL period of the DAB signal, the receiving device 200 can determine the information within the DAB signal, such as the length of the NULL period, the DAB mode, and the starting point of the DAB frames. When detecting the location of the NULL period of the DAB signal, the synchronization detection circuit 207 may output a synchronization signal to the FFT circuit of the signal processing circuit 206. In a preferred embodiment, when the synchronization detection circuit 207 detects and determines the NULL period, the second low pass filter 205 stops operating in order to reduce the power consumption. FIG. 8 illustrates a signal processing device such as a receiving device 300 according to a second embodiment of the present invention. Through the operation of the third low pass filter 308, the first low pass filter 303 can be implemented with a lower order filter, which has a lower order than that of the first low pass filter 203 in the first embodiment.

Those skilled in the art will readily observe that numerous modifications and alterations of the device and method may be made while retaining the teachings of the invention.

What is claimed is:

1. A receiving device, comprising:

a first signal processor, for receiving a radio frequency signal, and converting the radio frequency signal to generate a first signal, wherein the radio frequency signal comprises a plurality of frames;

a second signal processor, coupled to the first signal processor, for performing a Fourier transform operation on the first signal according to a synchronization signal to generate an output signal;

a first filter, coupled to the first signal processor, for filtering the first signal to generate a second signal; and a synchronization detection circuit, coupled to the first filter, for detecting the second signal to generate the synchronization signal;

wherein the first signal comprises a channel signal and at least a portion of neighboring channel signals from neighboring channels, the second signal comprises a null period of the channel signal, and the output signal corresponds to the channel signal, and the first signal processor comprises:

a tuner, for selecting and receiving an input signal to generate a third signal;

a first sampling device, for generating a digital signal according to the third signal;

a second low pass filter, having an input coupled to an output of the first sampling device, for receiving the digital signal from the first sampling device, and filtering the received digital signal to generate a fourth signal; and a second sampling device, having an input coupled to an output of the second low pass filter, for receiving the fourth signal from the second low pass filter, and generating the first signal according to the received fourth signal.

2. The device of claim 1, wherein the third signal comprises the portion of neighboring channel signals.

3. The device of claim 1, wherein the tuner comprises:

a surface acoustic wave (SAW) filter capable of being utilized for processing received signals of different specifications.

4. The device of claim 1, wherein the second signal processor comprises:

a Fourier transform circuit, for performing the frequency conversion operation on the first signal to generate a Fourier transform signal; and a post-processing circuit for receiving the Fourier transform signal and the synchronization signal to generate the output signal.

5. The device of claim 1, wherein the portion of neighboring channel signals is redundant for the output signal.

6. The device of claim 1, wherein the first filter is utilized for filtering out at least one portion of neighboring channel signals.

7. The device of claim 1, wherein the first filter is utilized for filtering out at least one portion of neighboring channel signals and a portion of the channel signal.

8. The device of claim 1, wherein the synchronization detection circuit is utilized for detecting the null period of the second signal to output the synchronization signal.

9. The device of claim 1, wherein after the synchronization detection circuit generates the synchronization signal, the first filter enters a power-saving mode.

10. The device of claim 1, wherein the first signal comprises at least one of a first transmission signal or a second transmission signal, the first transmission signal complies with digital audio broadcasting (DAB) specifications, and the second transmission signal complies with digital video broadcasting (DVB) specifications.

11. The device of claim 1, wherein the output signal comprises data of a moving picture experts group (MPEG) format.

12. A signal processing method, comprises:

receiving a radio frequency signal, wherein the radio frequency signal comprises a plurality of frames;

converting the radio frequency signal to generate a first signal, wherein the first signal comprises a channel signal and at least a portion of neighboring channel signals from neighboring channels;

filtering the first signal to generate a second signal;

detecting the second signal to generate a synchronization signal; and performing a Fourier transform operation on the first signal according to the synchronization signal to generate an output signal, wherein the output signal corresponds to the channel signal, and the second signal comprises a null period of the channel signal;

wherein the step of converting the radio frequency signal to generate the first signal comprises:

selecting and receiving an input signal to generate a third signal;

sampling the third signal to generate a digital signal;

receiving the digital signal and filtering the received digital signal to generate a fourth signal; and receiving the fourth signal, and sampling the received fourth signal to generate the first signal.

13. The method of claim 12, wherein the third signal comprises the portion of neighboring channel signals.

14. The method of claim 12, wherein the portion of neighboring channel signals is redundant for the output signal.

15. The method of claim 12, wherein at least one portion of neighboring channel signals and a portion of the channel signal are filtered out within the filtering step.

16. The method of claim 12, wherein the detecting step further comprises detecting the null period of the second signal to output the synchronization signal.

17. The method of claim 16, further comprising:

stopping filtering the first signal after the synchronization signal is generated.

18. The method of claim 12, wherein the first signal is an orthogonal frequency division multiplexing (OFDM) signal.

19. The method of claim 12, wherein the first signal comprises at least one of a first transmission signal or a second transmission signal, the first transmission signal complies with digital audio broadcasting (DAB) specifications, and the transmission second signal complies with digital video broadcasting (DVB) specifications.

20. A receiving device, comprising:

a first signal processor, for receiving a radio frequency signal, and converting the radio frequency signal to generate a first signal, wherein the radio frequency signal comprises a plurality of frames;

a first filter, coupled to the first signal processor for performing a first filtering operation upon the first signal;

a second signal processor, coupled to the first filter, for performing a Fourier transform operation on an output of the first filter according to a synchronization signal to generate an output signal;

a second filter, coupled to the first signal processor, for performing a second filtering operation upon the first signal to generate a second signal; and a synchronization detection circuit, coupled to the second filter, for detecting the second signal to generate the synchronization signal;

wherein the first signal comprises a channel signal and at least a portion of neighboring channel signals from neighboring channels, and the output signal corresponds to the channel signal.

* * * * *